US009568626B2

United States Patent
Ricks

(10) Patent No.: US 9,568,626 B2
(45) Date of Patent: Feb. 14, 2017

(54) FLEXIBLE PRINTED CIRCUITS IN MARINE GEOPHYSICAL STREAMERS

(71) Applicant: PGS Geophysical AS, Oslo (NO)

(72) Inventor: Jamie Alexander Ricks, Katy, TX (US)

(73) Assignee: PGS Geophysical AS, Oslo (NO)

( * ) Notice: Subject to any disclaimer, the term of this patent is extended or adjusted under 35 U.S.C. 154(b) by 163 days.

(21) Appl. No.: 14/504,924

(22) Filed: Oct. 2, 2014

(65) Prior Publication Data
US 2015/0362607 A1 Dec. 17, 2015

Related U.S. Application Data

(60) Provisional application No. 62/011,226, filed on Jun. 12, 2014.

(51) Int. Cl.
| | | |
|---|---|---|
| G01V 1/38 | (2006.01) | |
| G01V 1/22 | (2006.01) | |
| G01V 1/20 | (2006.01) | |
| H05K 1/02 | (2006.01) | |
| H05K 1/11 | (2006.01) | |
| H05K 1/18 | (2006.01) | |

(52) U.S. Cl.
CPC ............. *G01V 1/22* (2013.01); *G01V 1/201* (2013.01); *H05K 1/028* (2013.01); *H05K 1/0278* (2013.01); *H05K 1/0298* (2013.01); *H05K 1/115* (2013.01); *H05K 1/182* (2013.01); *G01V 1/38* (2013.01)

(58) Field of Classification Search
CPC ............ G01V 1/22; G01V 1/38; G01V 1/201; H05K 1/0298; H05K 1/115; H05K 1/182; H05K 1/0278; H05K 1/028; H05K 1/11; H05K 1/18; H05K 1/02
USPC .................. 367/15, 20; 174/254; 361/749
See application file for complete search history.

(56) References Cited

U.S. PATENT DOCUMENTS

| 4,695,787 A | 9/1987 | Billet et al. |
| 4,706,130 A * | 11/1987 | Yamakawa ........... H04N 1/1931 347/130 |
| 4,894,015 A | 1/1990 | Stockero et al. |
| 5,400,298 A | 3/1995 | Hepp |

(Continued)

FOREIGN PATENT DOCUMENTS

GB   2498994   7/2013

OTHER PUBLICATIONS

"Improved Harness Technology," Trackwise Designs Limited, available at http://www.trackwise.co.uk/innovations/improved-harness-technology, printed from the Internet on Oct. 6, 2014.

(Continued)

*Primary Examiner* — Daniel L Murphy

(57) ABSTRACT

Disclosed are flexible printed circuits incorporated into marine geophysical streamers. An embodiment discloses an apparatus comprising: a streamer; and a flexible printed circuit located in the streamer. Another embodiment discloses an apparatus comprising: a jacket; a strength member extending along a length of the jacket and disposed inside the jacket; geophysical sensors disposed inside the jacket; spacers disposed at spaced apart locations along the jacket; and a flexible printed circuit assembly extending along a length of the jacket. Another embodiment discloses a method comprising: towing at least one streamer in a body of water, wherein the at least one streamer comprises a flexible printed circuit.

20 Claims, 5 Drawing Sheets

(56) References Cited

U.S. PATENT DOCUMENTS

| | | | |
|---|---|---|---|
| 5,590,284 A * | 12/1996 | Crosetto | G06F 15/17368 |
| | | | 710/104 |
| 5,800,650 A * | 9/1998 | Anderson | H05K 3/361 |
| | | | 156/150 |
| 6,716,063 B1 | 4/2004 | Bryant et al. | |
| 7,545,703 B2 | 6/2009 | Lunde et al. | |
| 7,881,159 B2 | 2/2011 | Hegna et al. | |
| 2005/0146984 A1 | 7/2005 | Lee et al. | |
| 2005/0150713 A1 | 7/2005 | Garcia-Osuna | |
| 2011/0248718 A1 | 10/2011 | Sudow et al. | |

OTHER PUBLICATIONS

European Search Report for Application EP15171051 dated Nov. 20, 2015.
European Search Report for European Application No. 15171051 dated Mar. 3, 2016.
Maxi-Flex Extended Length Circuitry Trademark Status retrieved from Internet (http://tmsearch.uspto.gove/bin/showfield?=doc&state=4802:7285dk.3.2 retrieved on Feb. 19, 2016.

* cited by examiner

FLEXIBLE PRINTED CIRCUITS IN MARINE GEOPHYSICAL STREAMERS

CROSS-REFERENCE TO RELATED APPLICATIONS

The present application claims priority to U.S. Provisional Application No. 62/011,226, filed on Jun. 12, 2014, the entire disclosure of which is incorporated herein by reference.

BACKGROUND

Embodiments relate generally to marine geophysical surveying. More particularly, embodiments relate to incorporation of flexible printed circuits in marine geophysical streamers Techniques for marine surveying include marine geophysical surveying, such as seismic surveying and electromagnetic ("EM") surveying, in which geophysical data may be collected from below the Earth's surface. Geophysical surveying has applications in mineral and energy exploration and production to help identify locations of hydrocarbon-bearing formations. Marine geophysical surveying is typically performed using one or more marine geophysical streamers (or simply "streamers") towed below or near the surface of a body of water. The streamers are typically cables that include a plurality of sensors disposed thereon at spaced apart locations along the length of the cable. The sensors may be configured to generate a signal that is related to a parameter being measured by the sensor. An energy source may also be towed through the water by the same or a different vessel. At selected times, the energy source may be actuated to generate, for example, seismic or EM energy that travels downwardly into the subsurface rock. Seismic or EM energy that interacts with interfaces, generally at the boundaries between layers of rock formations, may be returned toward the surface and detected by the sensors on the streamers. The detected energy may be used to infer certain properties of the subsurface rock, such as structure, mineral composition and fluid content, thereby providing information useful in the recovery of hydrocarbons.

In geophysical surveying, the streamer is typically a cable made of multiple components, such as a wire bundle and strength members, all bundled together and covered with a protective outer skin or "jacket." The streamer may be up to several kilometers in length. A lead-in cable typically couples the streamer to the survey vessel. The wire bundle may be made up of electrical power conductors and electrical data communication wires. In some instances, fiber optics for data communication may be included in the wire bundle.

The wire bundles used in conventional streamers may have a number of drawbacks. For instance, the wire bundle may be susceptible to electrical interferences from adjacent wiring and can be co-located differently in each streamer section. This may create differences in electrical performance, which can cause anomalous electrical behaviors potentially resulting in non-reproducible failures. Current wire bundles also may consume a larger volume in the streamer requiring more buoyancy compensation and large sizes, which may limit the effective length of streamer a vessel can carry on a single winch. In addition, traditional wires may be insulated with various plastics which may be susceptible to mechanical deterioration and physical damage during the assembly process. Moreover, some current approaches that utilize individual wires and pairs of wires in the wire bundle may require time-consuming soldering to assemble with subsequent inspection to verify the soldering acceptability. Some current approaches may also utilize splicing of sensors and embedded electronics along the length of the streamer. This splicing process may be a time-consuming and costly part of the streamer assembly process. Additionally, this splicing process may have a relatively high failure rate during either assembly or use, for example, due to poor insulation of the splice or crossed wires.

BRIEF DESCRIPTION OF THE DRAWINGS

These drawings illustrate certain aspects of some of the embodiments of the present invention and should not be used to limit or define the invention.

DETAILED DESCRIPTION

It is to be understood the present disclosure is not limited to particular devices or methods, which may, of course, vary. It is also to be understood that the terminology used herein is for the purpose of describing particular embodiments only, and is not intended to be limiting. Although individual embodiments are discussed, the invention covers all combinations of all those embodiments. As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

Embodiments relate to incorporation of flexible printed circuit assemblies in streamers for transmission of analog signals, digital signals, and power through streamer sections. In particular embodiments, the flexible printed circuit assemblies may comprise one or more multiple flexible printed circuits having a length in excess of 36-inches, which is the panel length of conventional flexible printed boards. The flexible printed circuits may be serially connected to form a flexible printed circuit assembly. Flexible printed circuits have conventionally been used to form short connections in applications where flexibility is required (e.g., folding cellphones, cameras). Challenges exist to their implementation in geophysical surveying especially in applications where a length longer than the standard panel length of 36 inches is desired. However, embodiments disclosed herein employ the use of flexible printed circuits having a length in excess of 36 inches.

Incorporation of the flexible printed circuits into the streamer can replace currently used wire bundle architectures comprised of large individual conductors and twisted pairs. Advantageously, flexible printed circuits can reduce the weight and volume of wiring and can provide repeatable electrical characteristics as compared to current, conventional wire bundles. Additionally, assembly of flexible printed circuits may employ more automated and reliable termination processes such as, for example, crimping and Insulation Displacement Crimping ("IDC"), which may reduce time and inspection while improving reliability, especially when compared to current soldering approaches. Moreover, in contrast to current splicing techniques, flexible printed circuits may allow for simple, low-cost keyed connectors at each of the traditional splice points throughout the flexible printed circuit to ensure proper termination of sensors or other electronic boards, thus reducing potential assembly errors.

Figure 1:
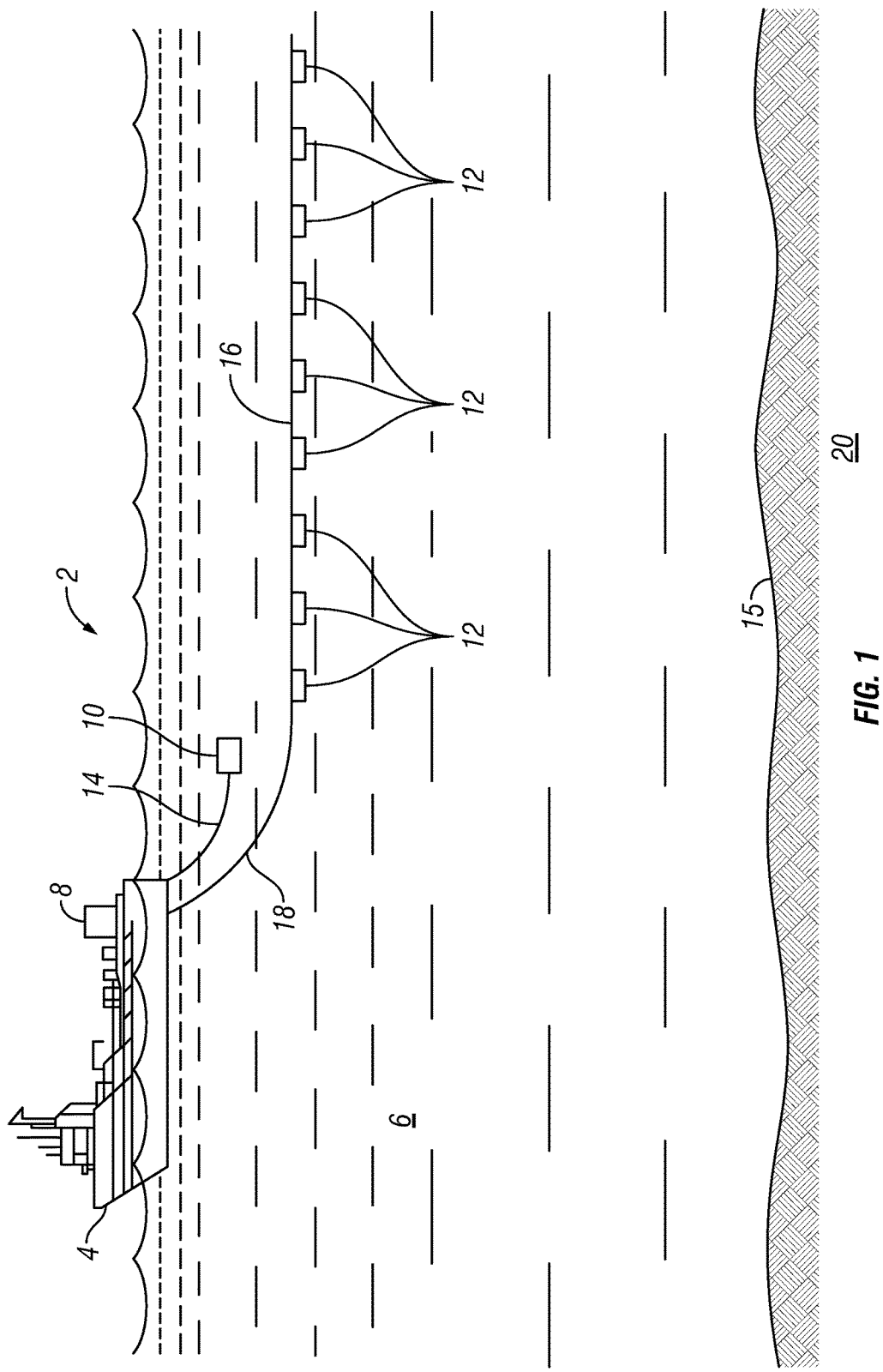
FIG. 1 illustrates an example embodiment of a marine geophysical survey system.

Referring now to FIG. 1, a marine geophysical survey system 2 is illustrated in accordance with example embodiments that may utilize flexible printed circuits. As illustrated, the marine geophysical survey system 2 may include a survey vessel 4 moving along the surface of a body of water 6, such as a lake or ocean. The survey vessel 4 may include thereon equipment, shown generally at 8 and referred to for convenience as a "recording system." The recording system 8 typically may include devices (none shown separately) for navigating the survey vessel 4 (such as global positioning system ("GPS") receivers), for actuating at least one energy source 10, and/or for recording signals generated by sensors 12.

As illustrated, the survey vessel 4 (or a different vessel) may tow the energy source 10 in the body of water 6. A source cable 14 may couple the energy source 10 to the survey vessel 4. In the illustrated embodiment, the energy source 10 is towed below the surface of the body of water 6. As illustrated, the energy source 10 may be below the surface of the body of water 6 and above water bottom 15, wherein the energy source 10 may be disconnected from the water bottom 15. For example, the energy source 10 may be towed in the body of water 6 at a depth ranging from 0 meters to about 300 meters. The energy source 10 may be any selectively actuable source suitable for marine geophysical surveying, including without limitation a seismic air gun, a water gun, a marine vibrator, an electromagnetic field transmitter, or an array of such devices. In some embodiments, seismic energy and/or electromagnetic energy may originate from the energy source 10. The energy source 10 may be towed in any suitable pattern for geophysical surveying, including in a parallel or orthogonal pattern, or possibly a circular or spiral pattern. It should be noted that, while the present example shows only a single energy source 10, the invention is applicable to any number of energy sources towed by the survey vessel 4 or any other vessel.

The survey vessel 4 (or another vessel) may further tow at least one streamer 16. While not illustrated separately in FIG. 1, the streamer 16 may include a flexible printed circuit assembly (e.g., flexible printed circuit assembly 22 on FIG. 2) for transmission of analog signals, digital signals, and power through streamer sections. The flexible printed circuit assembly may be used in place of large individual conductors and twisted pairs used in currently used wire bundle architectures. Incorporation of the flexible printed circuit assembly into the streamer 16 will be described in more detail below with respect to FIGS. 2-6.

The streamer 16 may be coupled to the survey vessel 4 by a lead-in cable 18. While not shown, the lead-in cable 18 may be deployed from the survey vessel 4 by a winch or other similar spooling device, for example, that can be used to control the deployed length of the lead-in cable 18. In alternative embodiments, the streamer 16 may alternatively be deployed on or near the water bottom 15 or towed by another vessel (not shown). As another alternative, one or more additional streamers (not shown) may be towed behind the survey vessel 4, towed behind another vessel (not shown), or deployed at or near the water bottom 15. It should be noted that, while the present example, shows only a single streamer 16, the invention is applicable to any number of streamers towed by the survey vessel 4 or any other vessel. For example, in some embodiments, eight or more streamers may be towed by the survey vessel 4, while in other embodiments, as many as twenty-six or more streamers may be towed by the survey vessel 4. Where multiple streamers are deployed, the streamers may be spaced apart laterally, vertically, or both laterally and vertically. "Lateral" or "laterally," in the present context, means transverse to the direction of the motion of the survey vessel 4.

The sensors 12 may be disposed at spaced apart locations on the streamer 16. The sensors 12 may be any type of sensor known in the art. While not shown, some marine seismic surveys locate the sensors 12 on ocean bottom cables or nodes in addition to, or instead of, the streamer 16. The sensors 12 may be any type of geophysical sensor known in the art, including seismic sensors, such as hydrophones, geophones, particle velocity sensors, particle displacement sensors, particle acceleration sensors, or pressure gradient sensors, or electromagnetic field sensors, such as electrodes or magnetometers.

During operation, the energy source 10 may be triggered at selected times. When triggered, the energy source 10 may produce energy that emanates outwardly from the energy source 10. The energy may travel downwardly through the body of water 6 and into rock formations 20 below the water bottom 15. The sensors 12 may detect energy that originated from the energy source 10 after it has interacted with the rock formations 20. By way of example, the sensors 12 may generate signals, such as electrical or optical signals, in response to the detected energy. Signals generated by the sensors 12 may be communicated to the recording system 8. The detected energy may be used to infer certain properties of the subsurface rock, such as structure, mineral composition and fluid content, thereby providing information useful in the recovery of hydrocarbons.

In accordance with an embodiment of the invention, a geophysical data product may be produced. The geophysical data product may include geophysical data obtained from one or more of the sensors 12 and may be stored on a non-transitory, tangible computer-readable medium. The geophysical data product may be produced offshore (i.e. by equipment on a vessel) or onshore (i.e. at a facility on land) either within the United States or in another country. If the geophysical data product is produced offshore or in another country, it may be imported onshore to a facility in the United States. Once onshore in the United States, geophysical analysis, including further data processing, may be performed on the geophysical data product.

Figure 2:
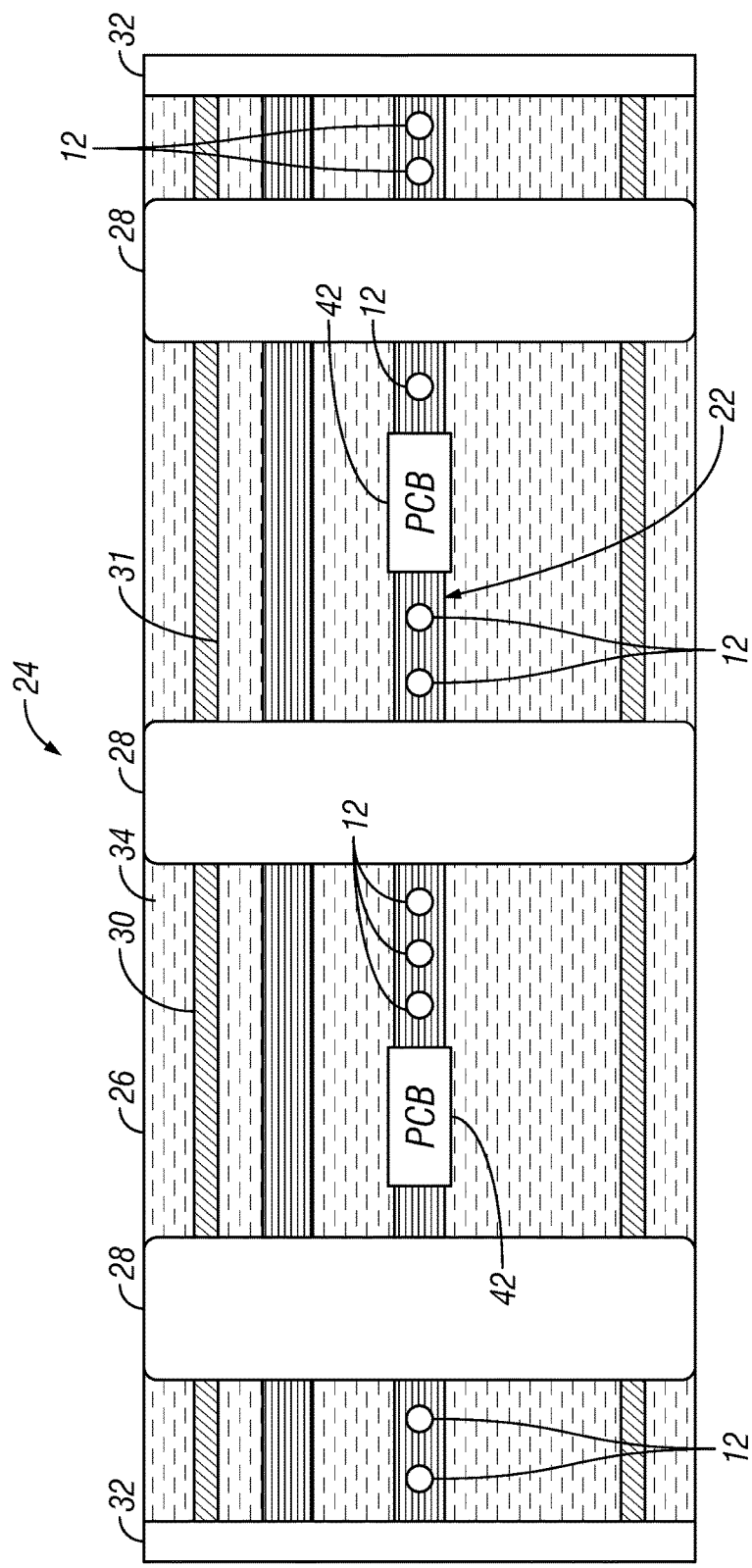
FIG. 2 illustrates a cut-away view of an example embodiment of a streamer section incorporating a flexible printed circuit assembly.

Having explained the general operation and method of the marine geophysical survey system 2, an example embodiment that incorporates a flexible printed circuit assembly 22 into a streamer segment 24 of a marine geophysical streamer (e.g., streamer 16 on FIG. 1) will now be described with reference to FIG. 2. FIG. 2 is a cutaway view of a streamer segment 24 that incorporates a flexible printed circuit assembly 22 in accordance with example embodiments. With additional reference to FIG. 1, a streamer 16 may extend behind the survey vessel 4 for several miles and may be made from a plurality of streamer segments (e.g., streamer segment 24 on FIG. 2) connected end-to-end behind the survey vessel 4.

Turning now to FIG. 2, an example embodiment of the streamer segment 24 is illustrated. The streamer segment 24 may have a length, for example, of about 75 meters to about 150 meters, wherein multiple segments may be serially joined to form a streamer (e.g., streamer 16 on FIG. 1) having a length ranging from 200 meters to about 2000 meters or longer, for example. A flexible printed circuit assembly 22 may be incorporated into the streamer segment 24. The streamer segment 24 may further include a jacket 26, buoyancy spacers 28, and strength members 30. As illustrated, the streamer segment 24 may also include a cable 31 for transmission of power/communication signals along the streamer segment 24. The cable 31 may transmit the power/communication signals to adjacent streamer segments. In addition, the cable 31 may be in the form, for example, of a wire bundle or a flexible printed circuit (e.g., flexible printed circuit 36 on FIGS. 3-7). Additionally, sensors 12 may be disposed on the streamer segment 24. As illustrated, the sensors 12 may be coupled to the flexible printed circuit assembly 22 and disposed inside the jacket 26. It should be understood that the particular configuration of the streamer segment 24 shown in FIG. 2 is merely illustrative and the present invention is intended to encompass other configurations that utilize a flexible printed circuit assembly 22.

The flexible printed circuit assembly 22 may conduct analog signals, digital signals, and/or power through the streamer segment 24. The flexible printed circuit assembly 22 may transmit signals to/from the sensors 12. The flexible printed circuit assembly 22 may conduct electrical signals to/from one or more components of the streamer segment 24, another streamer segment 24, or the recording system (e.g., recording system 8 on FIG. 1). The flexible printed circuit assembly 22 may also carry electrical power to various components (e.g., signal processors) disposed in the streamer segment 24 or elsewhere along the streamer (e.g., streamer 16 on FIG. 1). As will be discussed in more detail with respect to FIG. 3 below, one or more printed circuit boards 42 may be coupled to the flexible printed circuit assembly 22. The flexible printed circuit assembly 22 may be disposed in the jacket 26. As illustrated, the flexible printed circuit assembly 22 may be centrally located in the jacket 26 and may extend the length of the streamer segment 22. The flexible printed circuit assembly 22 may be terminated at coupling/termination plates 32 disposed on axial ends of the streamer segment 24.

While not illustrated on FIG. 2, the flexible printed circuit assembly 22 may comprise one or more flexible printed circuits (e.g., flexible printed circuit 36 on FIGS. 3-7), which may be serially connected to form the flexible printed circuit assembly 22. Examples of suitable flexible printed circuits include electronic circuits formed by mounting electronic devices onto flexible plastic substrates. In some embodiments, the flexible printed circuit assembly 22 may comprise multilayer flexible printed circuits. Embodiments of the flexible printed circuits may individually have a length in excess of 36 inches. Manufacturing processes typically limit the length of flexible printed circuits. While flexible printed circuits conventionally have a panel length of 36 inches or less, embodiments disclosed herein use specially designed flexible printed circuits to achieve a longer length. For example, a continuous flexible printed circuit, such as that described by UK patent GB 2498994, or a flexible printed circuit printed on a single rectangular sheet, which can then be cut into one or more single strips each in excess of 36 inches in length.

As illustrated, the streamer segment 24 may include a jacket 26, which at least partially covers streamer segment 24. The jacket 26 generally may function as a partial or complete exterior cover that protects the internal components of the streamer segment 24 from water intrusion, for example. In some embodiments, the jacket 26 may be made from a flexible, acoustically transparent material, which may be a plastic and/or elastomeric material, such as polyurethane. One or more coupling/termination plates 32 may be located at or near either axial end of the jacket 26. The coupling/termination plates 32 may couple the streamer segment 24 to another streamer segment.

The streamer segment 24 may further include strength members 30 disposed inside the jacket 26. In the illustrated embodiments, two strength members 30 are coupled to the interior of each of the coupling/termination plates 32 and extend the length of the streamer segment 24. In general, the strength members 30 may function to provide the streamer segment 24 with the ability to carry axial mechanical load, for example. For example, the strength members 30 may carry axial load along the length of the streamer segment 24. In some embodiments, the strength members 30 may be a metal, such as steel (e.g., stainless steel) or high strength plastic materials. Examples of suitable plastic materials include aramid fibers such as Kevlar polyamides. The strength members 30 may be in the form of a cable or fiber rope, for example.

The streamer segment 24 may further include buoyancy spacers 28 disposed along the length of the streamer segment 24. As illustrated, the buoyancy spacers 28 may be disposed at spaced apart locations along the length of the streamer segment 24. The buoyancy spacers 28 may be made from a foam material to provide buoyancy, for example. For example, the buoyancy spacers 28 may include a foamed material that fills void spaces, such as a foamed polyurethane or other suitable material. In some embodiments, the buoyancy spacers 28 may have a density selected to provide the streamer segment 24 with the same overall density as the water (e.g., body of water 6 on FIG. 1) so that the streamer segment 24 may be neutrally buoyant in the water. Density of the streamer segment 24 may be further adjusted, for example, using adding buoyancy spacers 28 or fill media having a selected density.

Oil or other suitable void-filling material 34 may occupy the interior volume of the streamer segment 24. The void-filling material 34 may function, for example, to exclude fluid such as water from the interior of the streamer segment 24. The void-filling material 34 may also function, for example, to electrically insulate other components of the streamer segment 24 and/or add buoyancy to the streamer segment 24. Examples of suitable void-filling materials may include oil, gel-like substances, and thermoplastics. In some embodiments, the void-filling material 34 may be inserted into the streamer segment 24 as a liquid and then cure into a non-flowable state.

While not illustrated, those of ordinary skill in the art should appreciate that additional devices may be incorporated into the streamer segment 24. For example, control surfaces, ballast tanks, openings, covers/lids, and connections points, among others, may be incorporated into the streamer segment 24. For example, control surfaces (such as wings) for steering or rotational position may be used. The control surfaces may act to provide depth and/or lateral control for the streamer segment 24. Moreover, the control surfaces may allow the streamer segment 24 to perform a desired move while in the water, such as an undulation, surfacing, diving, rescue, or recovery. Ballast tanks may be also be incorporated that can allow the streamer segment 24 to maintain depth, surface, or compensate for water intrusion, such as by gassing a flooded chamber in the streamer segment 24. Openings may also be provided for access to sensor surfaces, ballast, and/or weight/mass center manipulation. Connection points that are openable and/or closable may also be provided in the streamer segment 24, such as valves or ports for feed or transmission lines. Covers/lids that are openable and/or closable may also be provided, which may enable cleaning and/or streamlined handling, for example.

Figure 3:
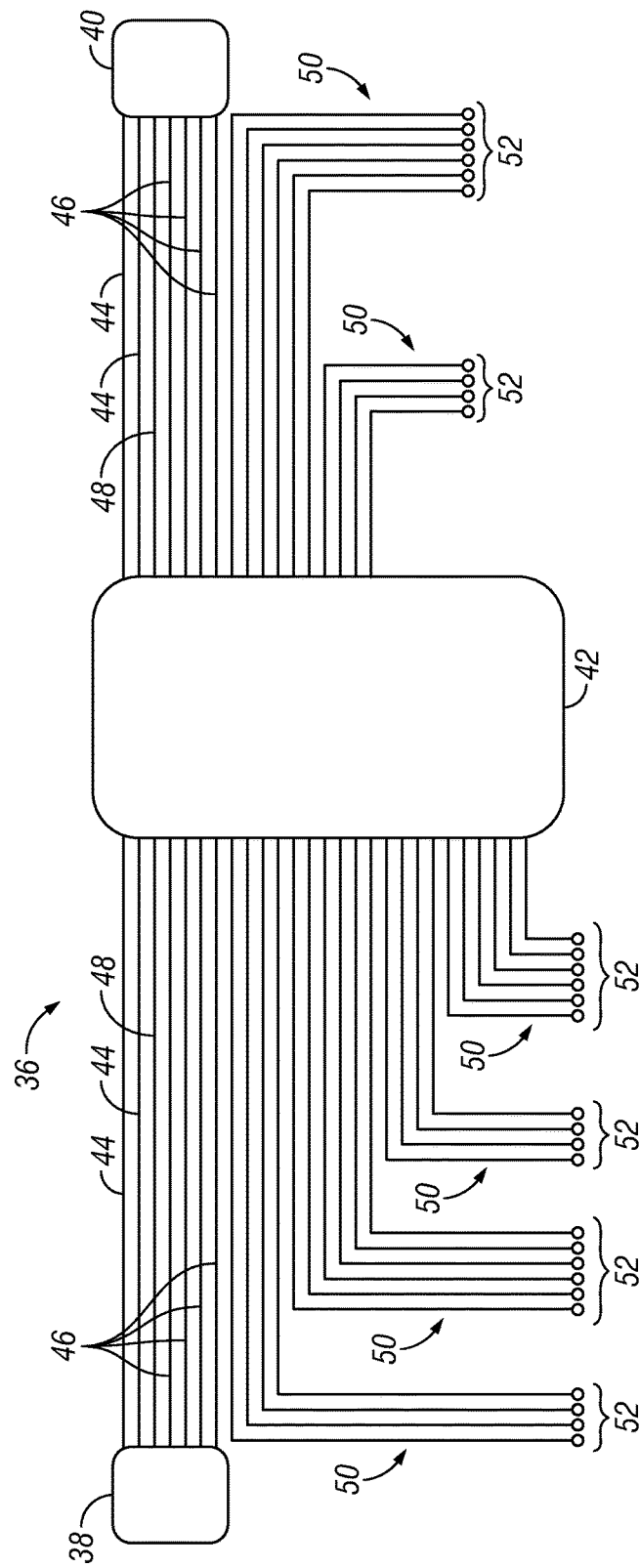
FIG. 3 illustrates an example embodiment of a flexible printed circuit for use in a streamer.

FIG. 3 illustrates a flexible printed circuit 36 which may be included in a flexible printed circuit assembly (e.g., flexible printed circuit assembly 22 on FIG. 2) for incorporation into a streamer (e.g., streamer 16 on FIG. 1). Certain components of the flexible printed circuit 36 such as the substrate are not illustrated on FIG. 3. Examples of suitable flexible circuits for the flexible printed circuit 36 may include a single layer flexible circuits, double layer flexible circuits, multilayer flexible circuits, and rigid-flex, multilayer circuits. In some embodiments, the flexible printed circuit 36 may be a multilayer flexible circuit.

The flexible printed circuit 36 may comprise a first connector 38 and a second connector 40 on opposite ends of the flexible printed circuit 36. The first connector 38 and the second connector 40 may be any of a variety of different connectors, including flexible circuit connectors such as pin connectors and socket connectors. A wide variety of different configurations for the first connector 38 and the second connector 40 may be utilized. In some embodiments, the first connector 38 may be a female socket connector, and the second connector 40 may be a male pin connector or vice versa. In particular embodiments, the first connector 38 may be a female 7-socket connector with the second connector 40 being a male 7-pin connector. A printed circuit board 42 may also be disposed on the flexible printed circuit 36. In some embodiments, the printed circuit board 42 may be a flexible printed circuit board. The printed circuit board 42 may include a number of different electronic components, including, for example, signal processing equipment, analog-to-digital converters, microcontrollers, field-programmable gate arrays ("FPGA's"), sensors, filters, power control integrated circuits, and signal conditioning integrated circuits, among others. The printed circuit board 42 may be coupled to the flexible printed circuit 36, for example, by a surface mounted connector that terminates to the mating connector on the flexible printed circuit 36. The flexible printed circuit 36 may alternatively be soldered directly onto the printed circuit board 42. The printed circuit board 42 may also be a rigid portion of a continuous flexible printed circuit 36. The printed circuit 42 may be considered an acquisition node that obtains and processes signals from sensors located on the streamer (e.g., streamer 12 on FIG. 1). The flexible printed circuit 36 may further include conductors, such as power conductors 44, communication conductors 46, and analog voltage conductors 48. The power conductors 44, communication conductors 46, and analog voltage conductors 48 may each include a pin on each end terminated in a ground shield. The power conductors 44 may extend along the length of the flexible printed circuit 36 for transmission of electrical power. The communication conductors 46 may extend along the length of the flexible printed circuit 36 for transmission of communication signals. The analog voltage conductors 48 may also extend along the length of the flexible printed circuit 36 for sensor data or test signals. It should be understood that FIG. 3 merely illustrates an example of a suitable flexible printed circuit 36 and embodiments may incorporate different numbers and/or types of conductors as may be appropriate for a particular application.

The flexible printed circuit 36 may further comprise sensor signal conductors 50. As illustrated, the sensor signal conductors 50 may extend from the printed circuit board 42 to a corresponding drop for coupling to one or more sensors (e.g., sensors 12 on FIGS. 1 and 2). The drops on FIG. 3 are illustrated by reference number 52. The sensor signal conductors 50 may extend from the printed circuit board 42 and terminate in a through hole or other suitable manner. The sensor signal conductors 50 may communicatively couple the one or more sensors (e.g., sensors 12 on FIGS. 1 and 2) to the printed circuit board 42. In some embodiments, the sensor signal conductors 50 may transmit signals, which may be analog or digital, to and/or from the printed circuit board 42 (or other component on the flexible printed circuit 36 or elsewhere) to the sensors. In particular embodiments, the sensor signal conductors 50 may transmit analog signals to the printed circuit board 42, which may then be converted to digital signals and transmitted, for example, by one or more of the communication conductors 46 to a recording system (e.g., recording system 8 on FIG. 1). For example, the communication conductors 46 may at least partially transmit the converted digital signals to the recording system.

Figure 4:
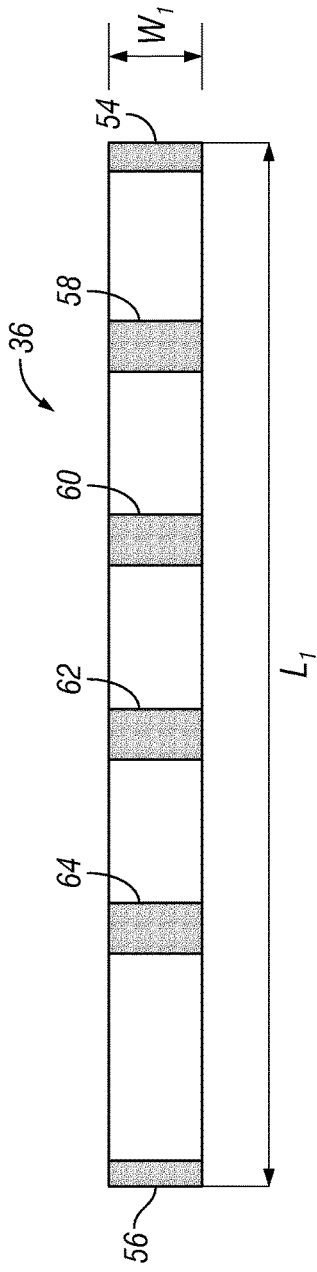
FIG. 4 illustrates another example embodiment of a flexible printed circuit for use in a streamer.

FIG. 4 illustrates another embodiment of the flexible printed circuit 36 which may be included in a flexible printed circuit assembly (e.g., flexible printed circuit assembly 22 on FIG. 2) for incorporation into a streamer (e.g., streamer 16 on FIG. 1). Certain components of the flexible printed circuit 36 such as the substrate and conductors are not illustrated on FIG. 4. The flexible printed circuit may have a printed circuit board termination 54 for connection to a printed circuit board (e.g., printed circuit board 42 on FIG. 3). The flexible printed circuit 36 may also have a connector termination end 56, which may include any of a variety of different flexible circuit connectors such as pin connectors and socket connectors. A number of conductors (not shown) may terminate at the printed circuit board termination 54. In some embodiments, the flexible printed circuit 36 may include twenty-seven conductors, which may terminate at the printed circuit board termination 54. The flexible printed circuit board 36, further includes four drops, first drop 58, second drop 60, third drop 62, and fourth drop 64. At the first drop 58, the flexible printed circuit 36 may drop a first set of conductors (e.g. six conductors) for coupling to one or more sensors (e.g., sensors 12 on FIG. 1 or FIG. 2). At the second drop 60, the flexible printed circuit 36 may drop a second set of conductors (e.g. four conductors) for coupling to one or more sensors. At the third drop 62, the flexible printed circuit 36 may drop a third set of conductors (e.g. six conductors) for coupling to one or more sensors. At the fourth drop 64, the flexible printed circuit 36 may drop a fourth set of conductors (e.g. six conductors) for coupling to one or more sensors. A reduced number of conductors (e.g., seven conductors) with respect to the number of conductors at the printed circuit board termination 54 may terminate at the connector termination end 56.

Figure 5:
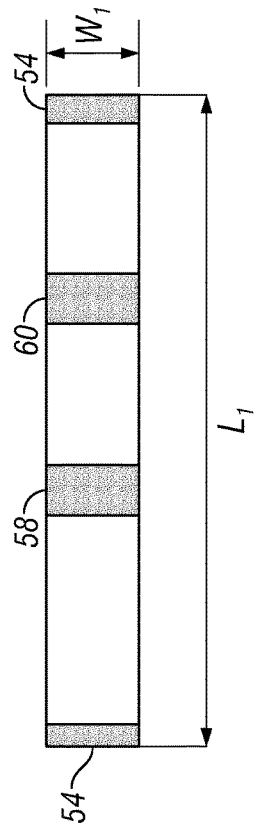
FIG. 5 illustrates another example embodiment of a flexible printed circuit for use in a streamer.

FIG. 5 illustrates another embodiment of a flexible printed circuit 36 which may be included in a flexible printed circuit assembly (e.g., flexible printed circuit assembly 22 on FIG. 2) for incorporation into a streamer (e.g., streamer 16 on FIG. 1). FIG. 5 is similar to FIG. 4 except that the flexible printed circuit 36 includes two drops, first drop 58 and second drop 60. As illustrated, the flexible printed circuit 36 may have a printed circuit board termination 54 and a connector termination end 56. A number of conductors (not shown) may terminate at the printed circuit board termination 54. In some embodiments, the flexible printed circuit 36 may include seventeen conductors, which may terminate at the printed circuit board termination 54. At the first drop 58, the flexible printed circuit 36 may drop a first set of conductors (e.g. four conductors) for coupling to one or more sensors (e.g., sensors 12 on FIG. 1 or FIG. 2). At the second drop 60, the flexible printed circuit 36 may drop a second set of conductors (e.g. six conductors) for coupling to one or more sensors. A reduced number of conductors (e.g., seven conductors) with respect to the number of conductors at the printed circuit board termination 54 may terminate at the connector termination end 56.

The particular configuration of the flexible printed circuit 36 may be varied as desired for a particular application. As previously described, embodiments of the flexible printed circuit 36 may have a length $L_1$ (see FIGS. 4 and 5) that exceeds 36 inches. In particular embodiments, the flexible printed circuit 36 may have a length $L_1$ of from about 1 meter to about 100 meters and, more particularly, from about 3 meters to about 14 meters. In specific embodiments, the flexible printed circuit 36 may have a length $L_1$ of about 1.105 meters or about 2.236 meters. In some embodiments, the flexible printed circuit board 36 may have a width $W_1$ (see FIGS. 4 and 5) of from about 0.1 meters to about 0.5 meters. In specific embodiments, the flexible printed circuit 36 may have a width $W_1$ of about 0.018542 meters. The number of sensor drops on the flexible printed circuit 36 may also vary. For example, the flexible printed circuit 36 may have any of a number of different drops, for example, suitable circuits may have from 2 to 10 drops or even more.

The spacing of components on the flexible printed circuit 36 may be selected for a particular application. For example, the spacing between adjacent drops (e.g., from first drop 58 to second drop 60, from second drop 60 to third drop 62, or from third drop 62 to fourth drop 64) or between drops and adjacent components (e.g., from printed circuit board termination 54 to first drop 58 on FIGS. 4 and 5, from connector termination end 56 to fourth drop 64 on FIG. 4, or from connector termination end 56 to second drop 60 on FIG. 5) may be adjusted as needed based on a number of factors, including signal integrity, voltage drop and engineering/geophysicists requirements. In particular embodiments, the spacing may be as small as about 0.1 meters and may be as large as about 0.5 meters or even larger. The spacing between each of the drops may not be equal. In specific embodiments, the spacing between each of the drops may range from about 0.3 meters to about 1.0 meters, for example, about 0.3 meters, about 0.4 meters, about 0.5 meters, about 0.6 meters, about 0.7 meters, about 0.8 meters, or about 0.9 meters. It should be understood that the length $L_1$, width $W_1$, drops, and spacings listed herein are merely illustrative and embodiments of the present disclosure should not be limited to specific configurations disclosed.

Figure 6:
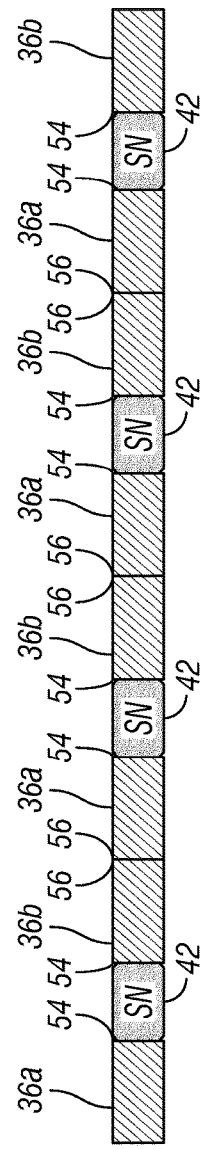
FIG. 6 illustrates an example embodiment of a flexible printed circuits connected in series to form a flexible printed circuit assembly for use in a streamer.

FIG. 6 illustrates an example embodiment of a flexible printed circuit assembly 22 made up of a number of flexible printed circuits, illustrated as flexible printed circuits 36a and flexible printed circuits 36b, which are serially connected to form the flexible printed circuit assembly 22. As illustrated, the flexible printed circuit assembly 22 may also comprise printed circuit boards 42, which may be acquisition nodes, for example. In the illustrated embodiment, each flexible printed circuit 36a may be coupled to a corresponding flexible printed circuit 36b at their corresponding connector termination ends 56. The printed circuit board termination 54 for each of the flexible printed circuits 36a and 36b may be coupled to the printed circuit boards 42. For example, each of the printed circuit boards 42 may be coupled between one of the flexible printed circuit boards 36a and one of the flexible printed circuit boards 36b.

Figure 7:
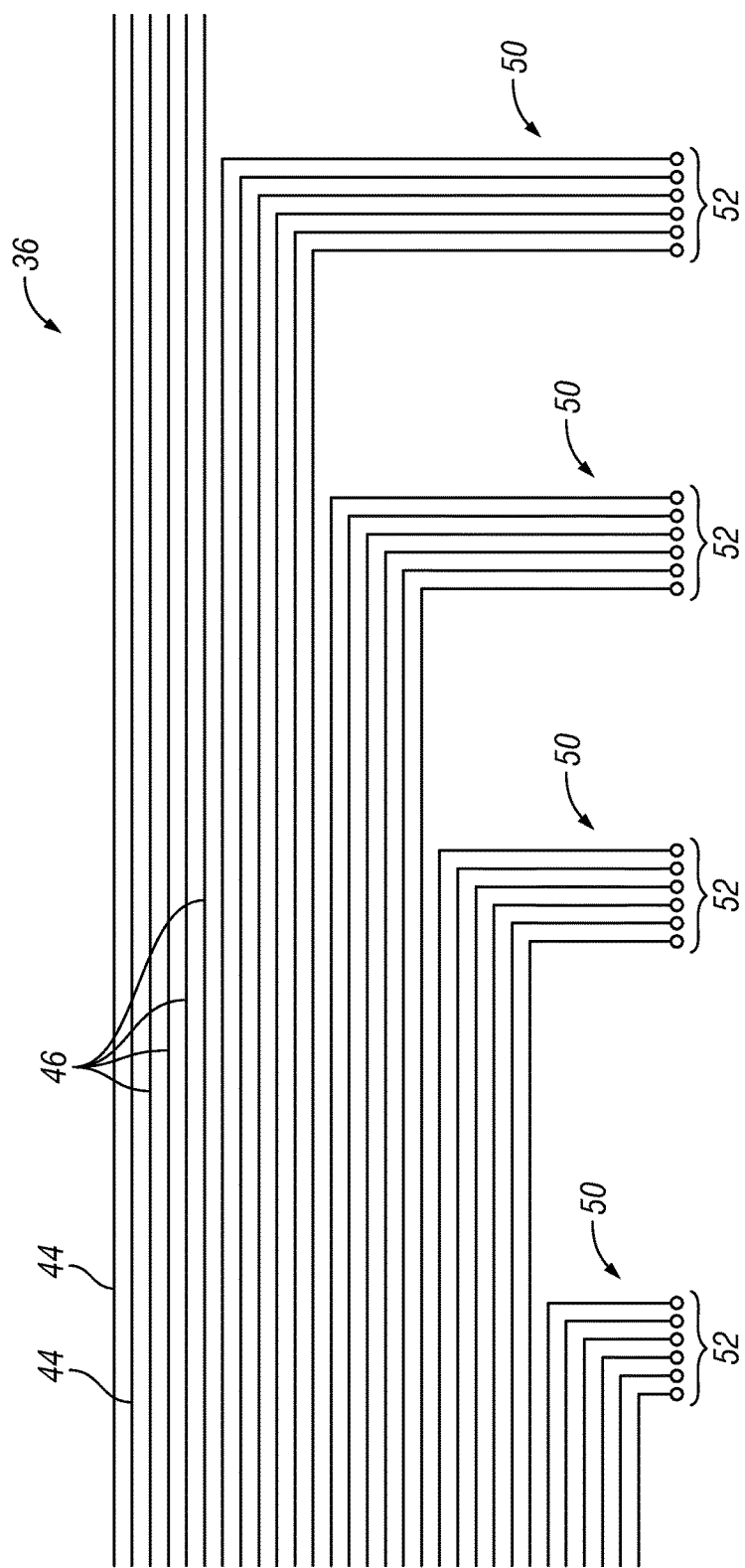
FIG. 7 illustrates another example embodiment of a flexible printed circuit for use in a streamer.

FIG. 7 illustrates conductor arrangement of another embodiment of a flexible printed circuit 36 which may be included in a flexible printed circuit assembly (e.g., flexible printed circuit assembly 22 on FIG. 2) for incorporation into a streamer (e.g., streamer 16 on FIG. 1). Certain components of the flexible printed circuit 36 such as the substrate and connectors are not illustrated on FIG. 7. The flexible printed circuit 36 may include conductors, such as power conductors 44 and communication conductors 46. The power conductors 44 may extend along the length of the flexible printed circuit 36 for transmission of electrical power. The communication conductors 46 may extend along the length of the flexible printed circuit 36 for transmission of analog and/or digital signals. It should be understood that FIG. 7 merely illustrates an example of a suitable flexible printed circuit 36 and embodiments may incorporate different number and/or types of conductors as may be appropriate for a particular application.

The flexible printed circuit 36 may further comprise sensor signal conductors 50. As illustrated, the sensor signal conductors 50 may extend from one end of the flexible printed circuit 36 to a corresponding drop for coupling to one or more sensors (e.g., sensors 12 on FIGS. 1 and 2). The drops on FIG. 5 are illustrated by reference number 52. In some embodiments, the sensor signal conductors 50 may transmit signals, which may be analog or digital, to and/or from a printed circuit board (e.g., printed circuit boards on FIG. 6 or other component on the flexible printed circuit 36 or elsewhere) to the sensors. In particular embodiments, the sensor signal conductors 50 may transmit analog signals, which may be converted to digital signals and transmitted, for example, to a recording system (e.g., recording system 8 on FIG. 1).

The foregoing figures and discussion are not intended to include all features of the present techniques to accommodate a buyer or seller, or to describe the system, nor is such figures and discussion limiting but exemplary and in the spirit of the present techniques.

What is claimed is:

1. An apparatus comprising:
   a streamer; and
   a flexible printed circuit assembly located in the streamer, wherein the flexible printed circuit assembly comprises flexible printed circuits that are serially connected end to end thereby extending longitudinally along the streamer.

2. The apparatus of claim 1, wherein the streamer comprises a geophysical sensor disposed on the streamer.

3. The apparatus of claim 2, wherein the flexible printed circuit assembly comprises a printed circuit board, and wherein conductors on the flexible printed circuit assembly communicatively couple the printed circuit board to the geophysical sensor.

4. The apparatus of claim 1, wherein the flexible printed circuit comprises a printed circuit board.

5. The apparatus of claim 1, wherein the flexible printed circuit comprises a flexible printed circuit board.

6. The apparatus of claim 1, wherein the flexible printed circuit is a multilayer flexible printed circuit.

7. The apparatus of claim 1, wherein at least one of the flexible printed circuits comprises a first drop and a second drop, wherein a first set of conductors at the first drop couple the at least one of the flexible printed circuits to a first sensor, wherein a second set of conductors at the second drop couple the at least one of the flexible circuits to a second sensor.

8. The apparatus of claim 1, wherein the streamer comprises streamer segments serially connected to form the streamer, wherein at least one of the streamer segments has a length ranging from about 75 meters to about 150 meters, where the flexible printed circuit assembly extends the length of the at least one of the streamer segments to terminate at axial ends of the at least one of the streamer segments.

9. The apparatus of claim 1, wherein the flexible printed circuit assembly comprises drops for a plurality of geophysical sensors.

10. The apparatus of claim 1, wherein the flexible printed circuits each have a length in excess of 36 inches.

11. An apparatus comprising:
a jacket;
a strength member extending along a length of the jacket and disposed inside the jacket;
geophysical sensors disposed inside the jacket;
spacers disposed at spaced apart locations along the jacket; and
a flexible printed circuit assembly extending longitudinally along a length of the jacket, wherein the flexible printed circuit assembly comprises flexible printed circuits that are serially connected end to end.

12. The apparatus of claim 11, wherein at least one of the geophysical sensors comprises a seismic sensor or an electromagnetic sensor.

13. The apparatus of claim 11, wherein at least one of the flexible printed circuits has a length in excess of 36 inches.

14. The apparatus of claim 13, wherein a printed circuit board is disposed between two of the flexible printed circuits that each have a termination at the printed circuit board.

15. The apparatus of claim 13, wherein at least one of the flexible printed circuits is coupled to a printed circuit board and communicatively couples the printed circuit board with the geophysical sensors.

16. The apparatus of claim 11, wherein at least one of the flexible printed circuits comprises drops for at least one of the geophysical sensors.

17. A method comprising:
towing at least one streamer in a body of water, wherein the at least one streamer comprises a flexible printed circuit assembly, wherein the flexible printed circuit assembly comprises flexible printed circuits that are serially connected end to end thereby extending longitudinally along the streamer.

18. The method of claim 17, further comprising detecting geophysical signals using at least one sensor disposed on the at least one streamer.

19. The method of claim 18, further comprising transmitting a signal from the at least one sensor along one or more conductors on the flexible printed circuit assembly.

20. The method of claim 19, further comprising transmitting a signal from the at least one sensor to a printed circuit board, and converting the signal from an analog signal to a digital signal, wherein the signal is transmitted along the one or more conductors on the flexible printed circuit assembly, and transmitting the digital signal from the printed circuit board to a recording system on a survey vessel along the one or more conductors on the flexible printed circuit assembly.

* * * * *